United States Patent
Park

(10) Patent No.: US 7,180,816 B2
(45) Date of Patent: Feb. 20, 2007

(54) ADDRESS CODING METHOD AND ADDRESS DECODER FOR REDUCING SENSING NOISE DURING REFRESH OPERATION OF MEMORY DEVICE

(75) Inventor: Chul-Woo Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 47 days.

(21) Appl. No.: 11/152,449

(22) Filed: Jun. 14, 2005

(65) Prior Publication Data

US 2006/0050591 A1    Mar. 9, 2006

(30) Foreign Application Priority Data

Sep. 9, 2004    (KR) .................. 10-2004-0072107

(51) Int. Cl.
  *G11C 8/00*    (2006.01)
(52) U.S. Cl. ............. 365/230.03; 365/222; 365/230.06
(58) Field of Classification Search ........... 365/230.03, 365/222, 230.06

See application file for complete search history.

(56) References Cited

U.S. PATENT DOCUMENTS 5,796,669 A    8/1998    Araki et al.
6,366,524 B1 *  4/2002    Abedifard .............. 365/230.06
6,373,769 B1 *  4/2002    Kiehl et al. ................. 365/222
6,721,223 B2 *  4/2004    Matsumoto et al. ........ 365/222
6,728,257 B1    4/2004    Bharghavan et al.

FOREIGN PATENT DOCUMENTS

JP    0330982    1/2003

OTHER PUBLICATIONS

English Abstract, Jan. 31, 2003 (See above).

* cited by examiner

*Primary Examiner*—Anh Phung
*Assistant Examiner*—Toan Le
(74) *Attorney, Agent, or Firm*—F. Chau & Associates, LLC

(57) ABSTRACT

An address coding method, which is performed by a memory device including a plurality of banks each being shared by at least two memory blocks, includes: activating adjacent banks shared by at least two memory blocks during a refresh operation of the memory device, and enabling the refresh operation in each bank alternately between the at least two memory blocks. The method includes activating adjacent banks shared by the at least two memory blocks during another operation of the memory device, and enabling the another operation in each bank alternately between the at least two memory blocks.

12 Claims, 4 Drawing Sheets

ADDRESS CODING METHOD AND ADDRESS DECODER FOR REDUCING SENSING NOISE DURING REFRESH OPERATION OF MEMORY DEVICE

BACKGROUND OF THE INVENTION

This application claims priority to Korean Patent Application No. 10-2004-0072107, filed on Sep. 9, 2004, in the Korean Intellectual Property Office, the disclosure of which is incorporated herein, in its entirety, by reference.

1. Field of the Invention

The present invention relates to a semiconductor memory device, and more particularly, to an address coding method for reducing sensing noise during refresh and to an address decoder for performing the same.

2. Description of Related Art

In dynamic random access memory devices (DRAMs), periodic memory cell data refresh is important. If a refresh operation is not performed periodically, charge leakage from memory cells can result in data loss.

As the capacity of DRAM increases, a time needed for refreshing increases. Accordingly, effects of increased refresh time on the performance of a DRAM system should be considered. Since the refresh operation of a DRAM is generally controlled by a memory controller, and the like, a time consumed by the memory controller for requesting a refresh operation increases, and may exceed a time allocated to a normal operation.

In high-capacity DRAM, "multi-bank" and "pre-fetch" architectures have been introduced for performing refresh operations. In a multi-bank system, it is possible to significantly reduce an access time through an interleave operation for partially overlapping a plurality of banks, each with a different row address.

Due to the increase in the operation speed of the DRAM, a difference between a data transmission speed on internal data paths and a data transmission speed between the DRAM and interfaces becomes greater. For example, for a DRAM operating at 1.6 Gbps, the data transfer rate is 1.6 Gbps at the external interface of DRAM. The external interface of DRAM performs data transfer operation without missing the data. Since the internal data paths perform complicated operations such as various calculations, amplification, and coding, the internal data paths cannot operate at a high speed such as 1.6 Gbps (or 1.6 GHz). For this reason, a pre-fetch method for processing data in parallel enables a reduced internal operation speed of the DRAM to be used. For example, the pre-fetch method processes 8 pieces of data in parallel, and serially arranges and outputs the processed data. Accordingly, the DRAM can internally operate at 200 MHz while an external interface thereof operates at 1.6 GHz.

In DRAMs, having a number of banks and a number of the pre-fetches, a bank is shared by a plurality of memory blocks. Here, each bank has its unique row control block and each memory block has its unique data path. FIG. 1 is a view for explaining a memory device 100 having memory blocks with a conventional multi-bank structure. Referring to FIG. 1, bank groups BANK0–BANK3 and BANK4–BANK7 are shared by upper and lower memory blocks 110–120 and 130–140, respectively. In detail, first through fourth banks BANK0–BANK3 are shared by first and second memory blocks 110 and 120, and fifth through eighth banks BANK4–BANK7 are shared by third and fourth memory blocks 130 and 140.

Assume that a most significant bit (MSB) of a row address signal for allocating each of the banks BANK0–BANK7 to one of the upper and lower memory blocks 110–120 and 130–140, is RA12, as shown in FIG. 2, ones of banks BANK0–BANK7 to be shared by the upper first and third memory blocks 110 and 130 are addressed by a row address signal with an MSB of RA12 ("12") and the others of the banks BANK0–BANK7 to be shared by the lower second and fourth memory blocks 120 and 140 are addressed by a row address signal with an MSB of $\overline{RA12}$ ("$\overline{12}$"). Since each of the banks BANK0–BANK7 is activated by a different row address signal, only one bank is activated during a normal operation, such as a read or write operation. However, during the refresh operation of the memory device 100, to reduce a time consumed for the refresh operation, all banks are activated to refresh memory cell data. Accordingly, as shown in FIG. 3, all of the banks BANK0–BANK7 shared by the upper first and third memory blocks 110 and 130 are activated to enable predetermined word lines 300 through 307. However, this method increases sensing noise since power consumption becomes non-uniform during the refresh operation.

SUMMARY OF THE INVENTION

According to an embodiment of the present disclosure, an address coding method, which is performed by a memory device including a plurality of banks each being shared by at least two memory blocks, comprises activating adjacent banks shared by different ones of the at least two memory blocks during a refresh operation of the memory device and enabling the refresh operation in each bank alternately between the at least two memory blocks. The method comprises activating adjacent banks shared by one of the at least two memory blocks during a normal operation of the memory device, and enabling the another operation in each bank to one of the at least two memory blocks.

The method comprises receiving an internal signal for enabling the refresh operation at a first plurality of multiplex units, and outputting the internal signal to a first plurality of bank decoders. The method comprises inverting the internal signal, outputting an inverted internal signal to a second plurality of multiplex units, outputting the inverted internal signal to a second plurality of bank decoders, each bank decoder corresponding to one of the adjacent banks; receiving a row address signal at each bank decoder, and activating a word line of each bank alternately between the at least two memory blocks, wherein a first bank of a first block receives the internal signal and a second bank of the first block adjacent to the first bank receives the inverted internal signal.

According to another embodiment of the present disclosure, a memory device including a plurality of banks each being shared by ones of upper memory blocks and lower memory blocks, comprises coding address signals of adjacent banks for alternately activating the adjacent banks of the upper memory blocks or the lower memory blocks alternately, during a refresh operation of the memory device; and coding address signals of adjacent banks for activating the adjacent banks of one of the upper memory blocks and the lower memory blocks, during another operation of the memory device.

The memory device further comprises a plurality of bank decoders, each bank decoder coupled to a corresponding bank, the plurality of bank decoders outputting the coding address signals, each coding address signal specifying a word line and a row address of each bank.

A bank shared between an upper memory block and a lower memory block is activated in one of the upper memory block and the lower memory block in response to the coding address signals and deactivated in the one of the upper memory block and the lower memory block in response to the coding address signals.

The coding address signal is output by a decoder in response to an internal signal output by a multiplex unit and a row address signal.

According to still another embodiment of the present disclosure, an address decoder of a memory device having a structure in which a plurality of banks are shared by upper and lower memory blocks, comprises multiplex (MUX) units selecting one of an internal address signal and an external address signal for allocating each of the plurality of banks to one of the upper and lower memory blocks, in response to a refresh signal; and bank decoders, each connected to each of the plurality of banks, receiving the internal address signal or the external address signal output from the MUX units with row address signals input to the memory device, decoding the received signals, and activating word lines in corresponding banks, wherein during a refresh operation of the memory device, the MUX units provide the internal address signal and an inverted signal of the internal address signal alternately to the bank decoders.

The address decoder further comprises an inverter receiving the internal address signal and outputting the inverted signal of the internal address signal. The inverter is coupled to a subset of the plurality of multiplex units providing the inverted signal of the internal address signal.

BRIEF DESCRIPTION OF THE DRAWINGS

The above and other features of the present invention will become more apparent by describing in detail exemplary embodiments thereof with reference to the attached drawings in which.

DETAILED DESCRIPTION OF PREFERRED EMBODIMENTS

Hereinafter, embodiments of the present disclosure will be described in detail with reference to the appended drawings. Like reference numbers refer to like components throughout the drawings.

Figure 1:
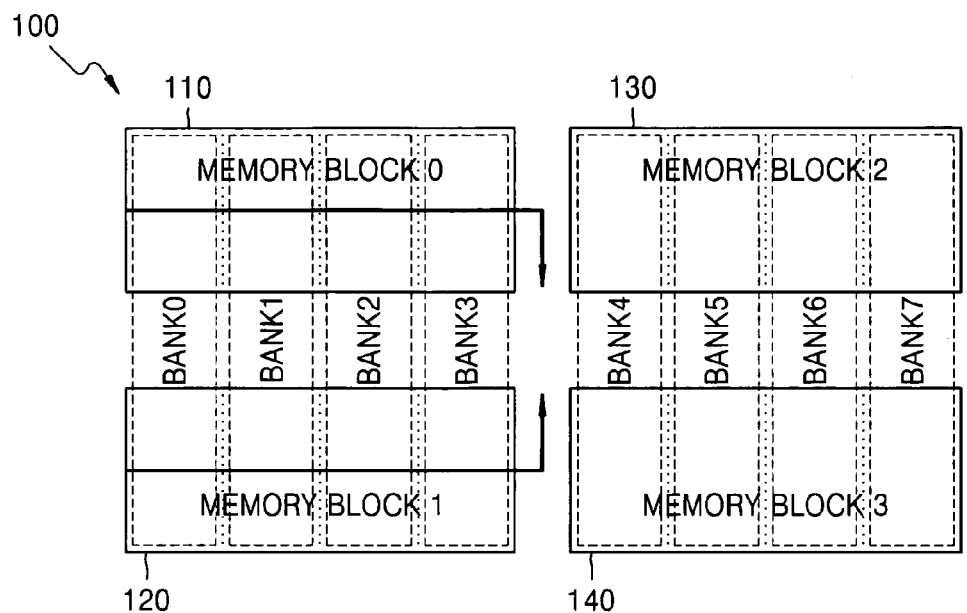
FIG. 1 is a view for explaining a memory device having memory blocks with a conventional multi-bank structure.
Figure 2:
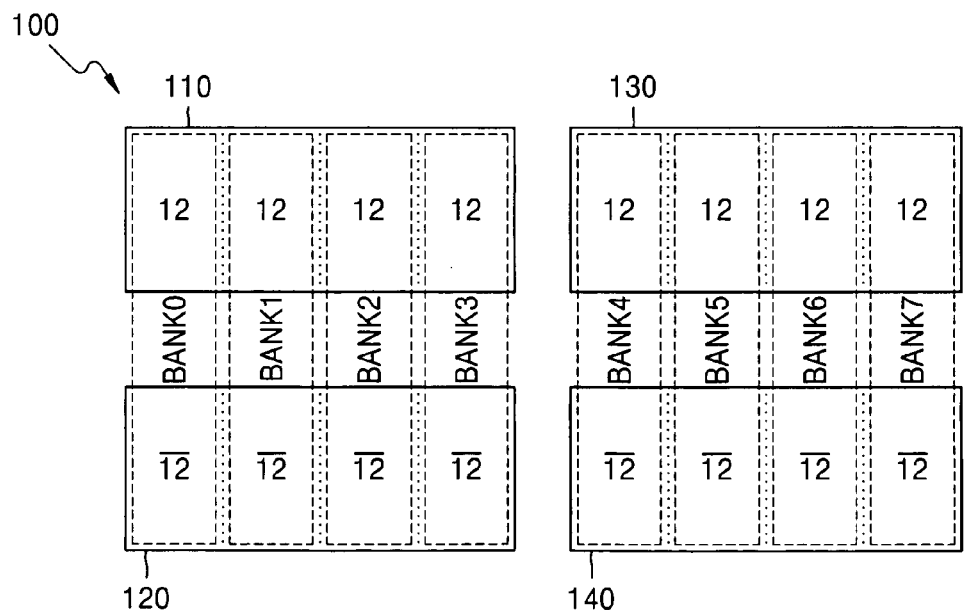
FIG. 2 is a view for explaining a conventional row address coding method used by the memory device of FIG. 1.
Figure 3:
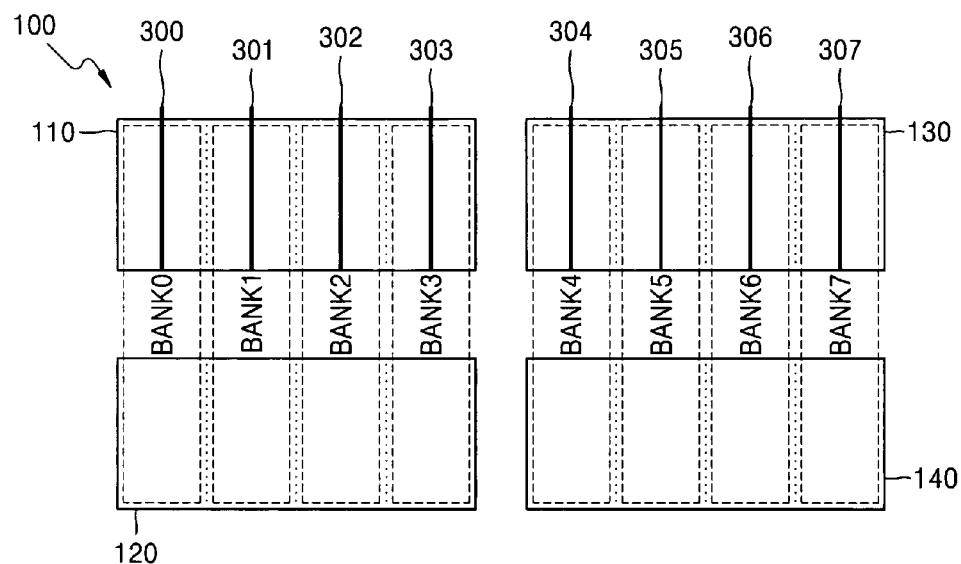
FIG. 3 is a view for explaining banks activated during a refresh operation in the memory device of FIG. 1.
Figure 4A:
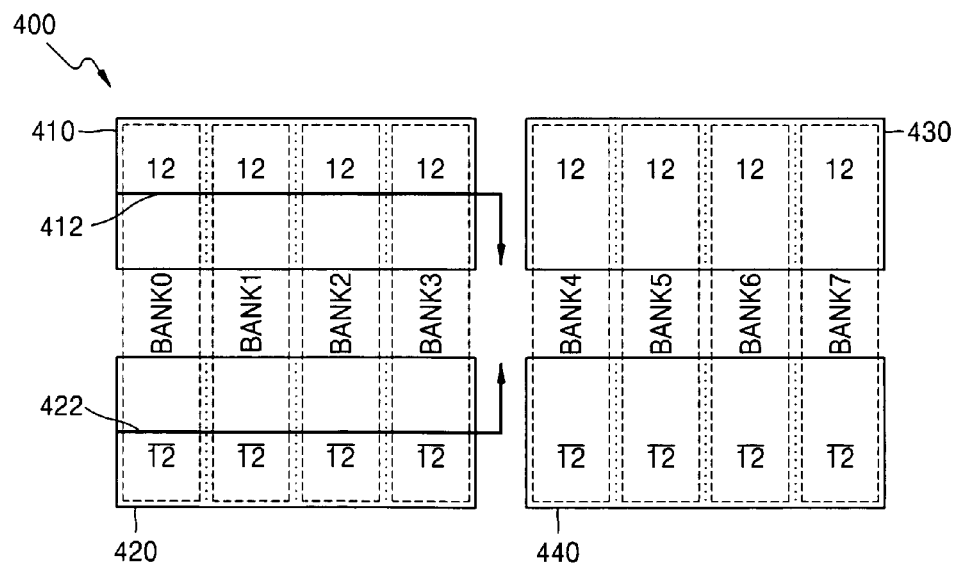
FIGS. 4a and 4b are views for explaining a memory device using a row address coding method according to an embodiment of the present disclosure.
Figure 4B:
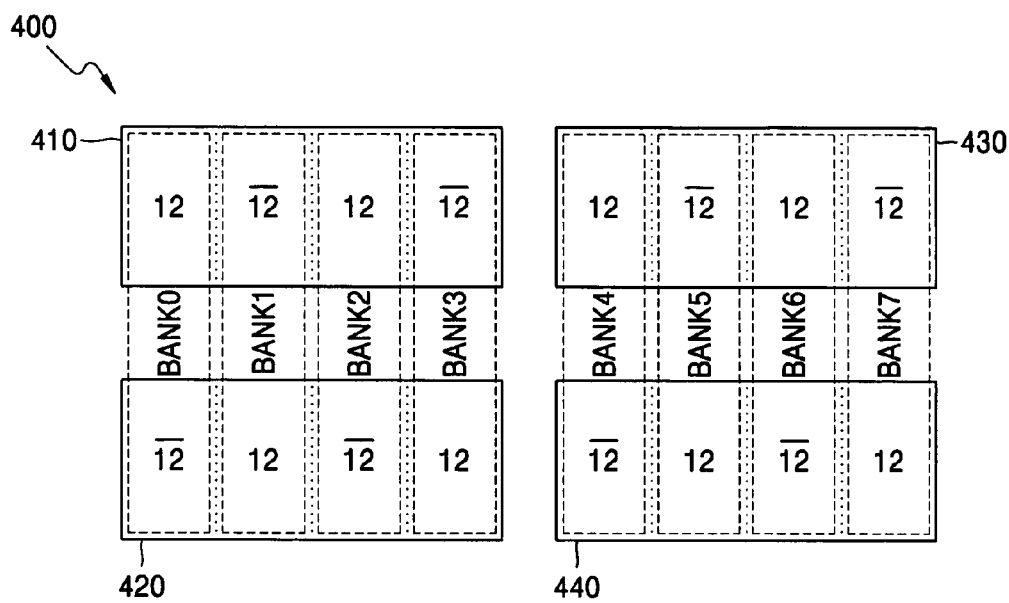

FIGS. 4a and 4b are views for explaining a memory device using a row address coding method according to an embodiment of the present disclosure. FIG. 4a is a view for explaining the row address coding method during an operation, such as a read or write operation and FIG. 4b is a view for explaining the row address coding method during a refresh operation.

Referring to FIG. 4a, as described above, an MSB of a row address signal for allocating portions of each of bank BANK0–BANK7 to one of upper and lower memory blocks 410–420 and 430–440, is RA12. Portions of banks BANK0–BANK7, within the upper first and third memory blocks 410 and 430, are addressed by a row address signal with an MSB of RA12 ("12") and the portions banks BANK0–BANK7 within the lower second and fourth memory blocks 420 and 440 are addressed by a row address signal with an MSB of $\overline{RA12}$ ("$\overline{12}$"). Accordingly, first through fourth banks BANK0–BANK3 shared by the first memory block 410 receive or transmit memory cell data through a first data path 412 in response to the row address signal with the MSB of RA12 during the normal operation. First through fourth banks BANK0–BANK 3 shared by the second memory block 420 receive or transmit memory cell data through a second data path 422 in response to the row address signal with the MSB of $\overline{RA12}$.

FIG. 4b is a view for explaining a row address coding method during a refresh operation. Referring to FIG. 4b, the neighboring banks BANK0–BANK3 shared by the first memory block 410 are alternately addressed in an order of RA12-$\overline{RA12}$-RA12-$\overline{RA12}$, and the neighboring banks BANK0–BANK3 shared by the second memory block 420 are alternately addressed in an order of $\overline{RA12}$-RA12-$\overline{RA12}$-RA12. Likewise, the neighboring banks BANK4–BANK7 shared by the third memory block 430 are alternately addressed in an order of RA12-$\overline{RA12}$-RA12-$\overline{RA12}$, and the neighboring banks BANK4–BANK7 shared by the fourth memory block 440 are alternately addressed in an order of $\overline{RA12}$-RA12-$\overline{RA12}$-RA12.

Figure 5:
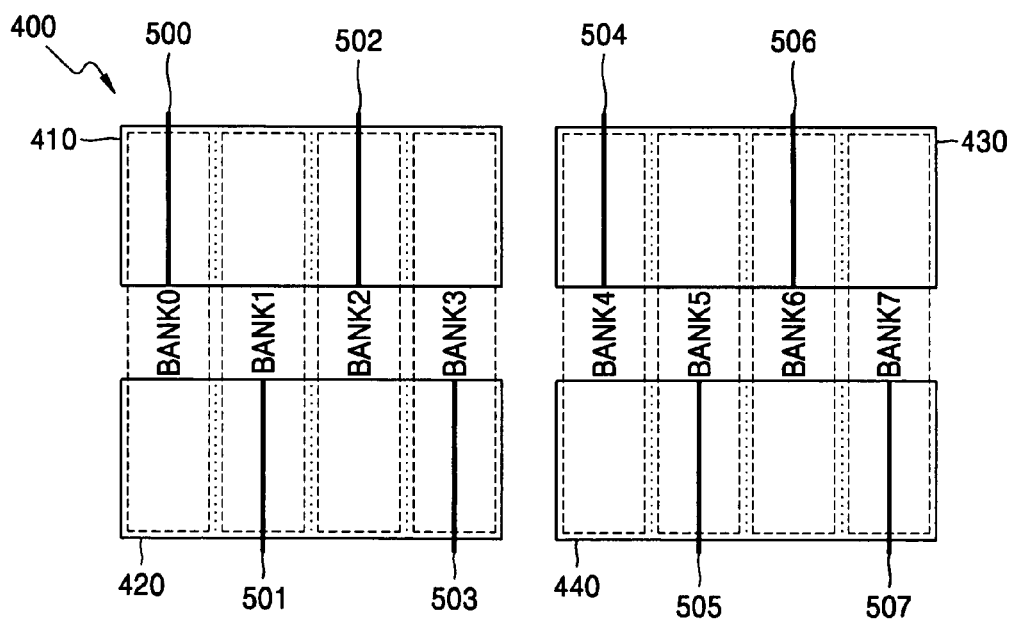
FIG. 5 is a view for explaining banks activated during a refresh operation in the memory device of FIG. 4.

During the refresh operation of the memory device 400, the banks BANK0–BANK3 and BANK4–BANK 7, which are activated in response of a row address signal RA12, as shown in FIG. 5, are uniformly distributed to the upper first and third memory blocks 410 and 430 and the lower second and fourth memory blocks 420 and 440. The banks BANK0–BANK3 and BANK4–BANK 7, which are activated in response of a row address signal $\overline{RA12}$ are uniformly distributed to the upper first and third memory blocks 410 and 430 and the lower second and fourth memory blocks 420 and 440, e.g., at second memory block 420, BANK0. Therefore, although all of the banks BANK0–BANK7 are activated during the refresh operation, only predetermined word lines 500 through 507 in the banks BANK0–BANK7 shared by the upper first and third memory blocks 410 and 430 and in the banks BANK0–BANK7 shared by the lower second and fourth memory blocks 420 and 440 are enabled to refresh memory cell data. Accordingly, it is possible to maintain uniform power consumption in the memory device 400 during the refresh operation, thereby reducing the sensing noise.

Figure 6:
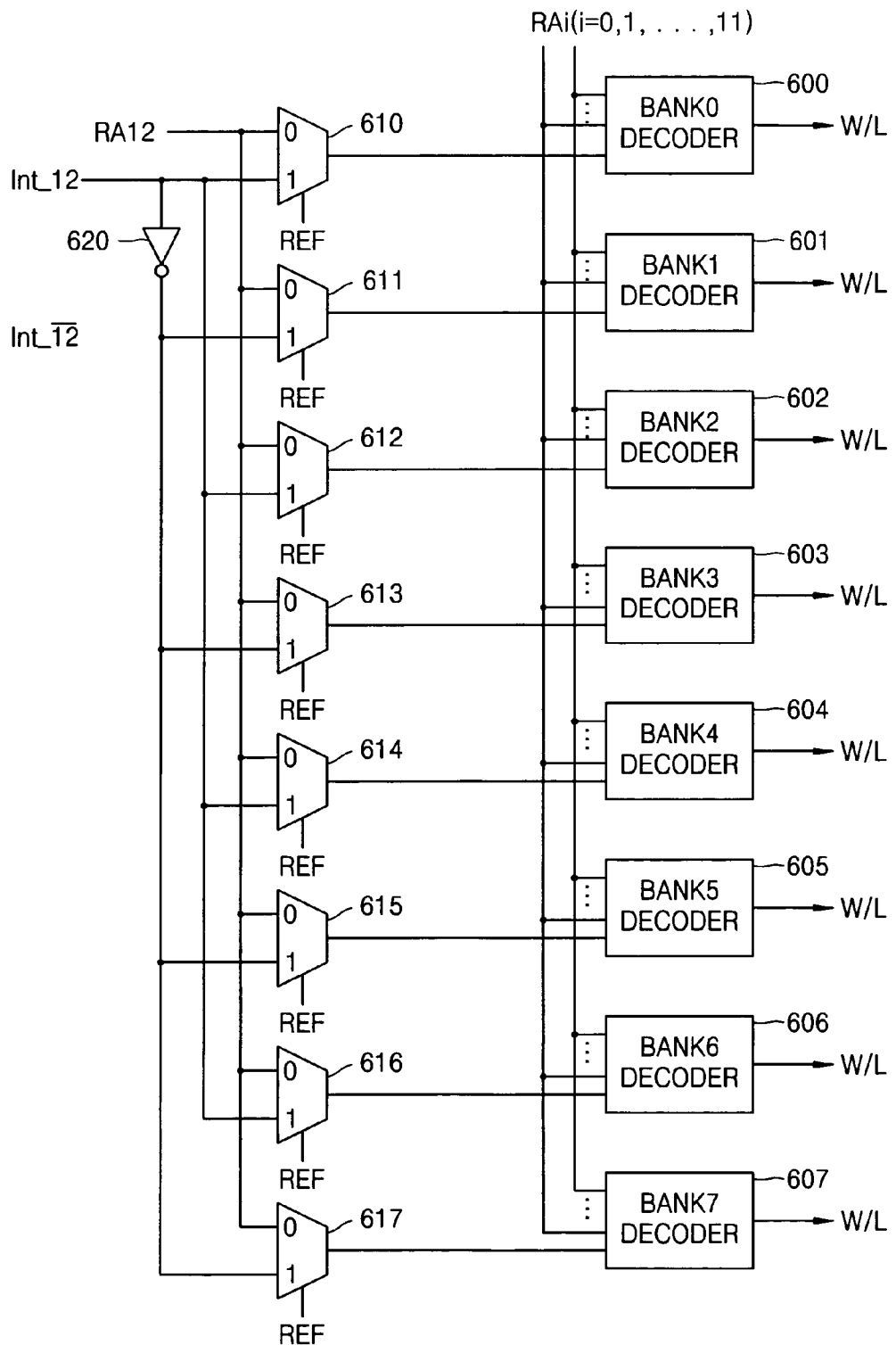
FIG. 6 is a block diagram of a row decoder according to an embodiment of the present disclosure.

FIG. 6 is a block diagram of a row decoder according to an embodiment of the present disclosure, implementing the row address coding method described above with reference to FIGS. 4a and 4b. Referring to FIG. 6, the row decoder includes first through eighth bank decoders 600 through 607, first through eighth MUX units 610 through 617, and an inverter 620. Each of the first through eighth bank decoders 600 through 607 output coding address signals for activating a word line of a corresponding bank, in response to a row address signal RAi (i=0, 1, . . . , 11) and an output of the first through eighth MUX units 610 through 617. Each of the first through eighth MUX units 610 through 617 selects an external signal RA12 or one of internal signals Int_12 and Int_$\overline{12}$ in response to a refresh signal REF, and transfers the selected signal to the first through eighth bank decoders 600 through 607. If the inverter 620 receives the internal signal Int_12, the inverter 620 outputs an internal signal Int_$\overline{12}$.

If the refresh signal REF is not activated, the first through eighth MUX units 610 through 617 transfer the external signal RA12 to the first through eighth bank decoders 600 through 607. The first through eighth bank decoders 600 through 607 receive row address signals RAi (i=0, 1, ..., 11) and the external signal RA12, decode the received signals, and output a coding address signal for activating word lines W/L of corresponding banks so that the normal operation is performed. Accordingly, during the normal operation, the row address coding as shown in FIG. 4*a* is implemented.

If the refresh signal REF is activated, the first through eighth MUX units 610 through 617 transfer the internal signals Int_12 and Int_$\overline{12}$ to the first through eighth bank decoders 600 through 607, wherein the internal signal Int_12 is transferred to the first, third, fifth, and seventh bank decoders 600, 602, 604, and 606 and the internal signal Int_$\overline{12}$ is transferred to the second, fourth, sixth, and eighth bank decoders 601, 603, 605, and 607. The first, third, fifth, and seventh bank decoders 600, 602, 604, and 606 activate word lines W/L of corresponding banks in response to the internal signal Int_12 and the row address signals RAi (i=0, 1, ..., 11). The second, fourth, sixth, and eighth bank decoders 601, 603, 605, and 607 activate word lines W/L of corresponding banks in response to the internal signal Int_$\overline{12}$ and the row address signals RAi (i=0, 1, ..., 11). Accordingly, during the refresh operation, the row address coding as shown in FIG. 4*b* is implemented.

While the present invention has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. An address coding method, which is performed by a memory device including a plurality of banks each being shared by at least two memory blocks, comprising:
   activating adjacent banks shared by the at least two memory blocks during a refresh operation of the memory device;
   enabling the refresh operation in each bank alternately between the at least two memory blocks;
   activating the adjacent banks shared by the at least two memory blocks during another operation of the memory device; and
   enabling the another operation in each bank to one of the at least two memory blocks.

2. The method of claim 1, wherein each of the at least two memory blocks has a unique data path.

3. The method of claim 1, further comprising:
   receiving an internal signal for enabling the refresh operation at a first plurality of multiplex units;
   outputting the internal signal to a first plurality of bank decoders;
   inverting the internal signal;
   outputting an inverted internal signal to a second plurality of multiplex units;
   outputting the inverted internal signal to a second plurality of bank decoders, each bank decoder corresponding to one of the adjacent banks;
   receiving a row address signal at each bank decoder; and
   activating a word line of each bank alternately between the at least two memory blocks, wherein a first bank of a first block receives the internal signal and a second bank of the first block adjacent to the first bank receives the inverted internal signal.

4. A memory device including a plurality of banks each being shared by a plurality of upper memory blocks and a plurality of lower memory blocks, comprising:
   coding address signals of adjacent banks for alternately activating the adjacent banks of the upper memory blocks and the lower memory blocks, during a refresh operation of the memory device; and
   coding address signals of adjacent banks for activating the adjacent banks of one of the upper memory blocks and the lower memory blocks, during another operation of the memory device.

5. The memory device of claim 4, further comprising a plurality of bank decoders, each bank decoder coupled to a corresponding bank, the plurality of bank decoders outputting the coding address signals, each coding address signal specifying a word line and a row address of each bank.

6. The memory device of claim 4, wherein a bank shared between an upper memory block and a lower memory block is activated in one of the upper memory block and the lower memory block in response to the coding address signals and deactivated in the one of the upper memory block and the lower memory block in response to the coding address signals.

7. The memory device of claim 4, wherein the coding address signal is output by a decoder in response to an internal signal output by a multiplex unit and a row address signal.

8. An address decoder of a memory device having a structure in which a plurality of banks are shared by an upper memory block and a lower memory block, the address decoder comprising:
   a plurality of multiplex units, each multiplex unit selecting one of an internal address signal and an external address signal, the plurality of multiplex units for allocating each of the plurality of banks to one of the upper memory block and the lower memory block, in response to a refresh signal; and
   a plurality of bank decoders, each bank decoder connected to each of the plurality of banks, receiving the internal address signal or the external address signal output from the multiplex units with row address signals input to the memory device, decoding the received signals, and activating word lines in corresponding banks,
   wherein during a refresh operation of the memory device, the multiplex units provide the internal address signal and an inverted signal of the internal address signal alternately to the bank decoders.

9. The address decoder of claim 8, wherein the internal address signal is generated from the external address signal.

10. The address decoder of claim 8, wherein each of the upper and lower memory blocks has a unique data path.

11. The address decoder of claim 8, further comprising an inverter receiving the internal address signal and outputting the inverted signal of the internal address signal.

12. The address decoder of claim 11, wherein the inverter is coupled to a subset of the plurality of multiplex units providing the inverted signal of the internal address signal.

* * * * *